United States Patent
Bigarre et al.

(10) Patent No.: US 6,730,908 B2
(45) Date of Patent: May 4, 2004

(54) METHOD FOR CHARGING A STRUCTURE COMPRISING AN INSULATING BODY

(75) Inventors: Janick Bigarre, Tours (FR); Patrick Hourquebie, Esvres sur Indre (FR); Jérôme Matallana, Ste Marie Kergue (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/362,212

(22) PCT Filed: Jun. 27, 2002

(86) PCT No.: PCT/FR02/02236
§ 371 (c)(1),
(2), (4) Date: Feb. 26, 2003

(87) PCT Pub. No.: WO03/003032
PCT Pub. Date: Jan. 9, 2003

(65) Prior Publication Data
US 2003/0183764 A1 Oct. 2, 2003

(30) Foreign Application Priority Data
Jun. 29, 2001 (FR) .............................. 01 08643

(51) Int. Cl.[7] .................. G01R 27/26; H01J 37/30
(52) U.S. Cl. .............. 250/310; 250/306; 250/307; 250/492.3; 324/452
(58) Field of Search .................. 250/306, 307, 250/310, 492.3; 324/452

(56) References Cited

U.S. PATENT DOCUMENTS 5,329,129 A * 7/1994 Shono et al. ............ 250/492.3
6,465,781 B1 * 10/2002 Nishimura et al. ........ 250/306
2003/0146381 A1 * 8/2003 Simon et al. .............. 250/310

FOREIGN PATENT DOCUMENTS

EP    0 398 269    11/1990
WO    00 20851    4/2000

OTHER PUBLICATIONS

A. Crisci et al.: "Surface–potential decay due to surface conduction" European Physical Journal Applied Physics, EDP Sciences, Les Ulis, FR, vol. 4, No. 1, pp. 107–116 1998.

DK Das–Gupta: "Charge decay on polymer surfaces" Journal of Electrostatics, vol. 23, No. 1, pp. 331–340. Apr. 1, 1989.

DK Das–Gupta: "Surface charge decay on insulating films" Proceedings of the International Conference on Properties and Applications of Dielectric Materials, Beijing, vol. 2, CONF. 2, pp. 602–605 Sep. 12, 1988–Sep. 16, 1988.

* cited by examiner

*Primary Examiner*—Jack Berman
(74) *Attorney, Agent, or Firm*—Oblon, Spivak, McClelland, Maier & Neustadt, P.C.

(57) ABSTRACT

Process for charging a structure formed from an insulating body sandwiched between two electrodes. In the process a Faraday cage is placed in contact with one of the electrodes of the structure, the potential of the other electrode being made equal to a reference potential. Electrons originating from a controlled electron emission device are introduced into the Faraday cage, the electrons reaching the electrode with which the Faraday cage is in contact to charge the structure. Such a process may find particular application for determining properties of insulating materials.

22 Claims, 4 Drawing Sheets

METHOD FOR CHARGING A STRUCTURE COMPRISING AN INSULATING BODY

TECHNICAL DOMAIN

The present invention relates to a process for charging a structure comprising an insulating body and a charging device for such a structure. Control of conditions for charging an insulating body, in other words knowledge of the quantity of the charge and the distribution of the charges then makes it possible to study the potential decay phenomenon from when it starts, and the potential return with time after the structure has discharged. These studies then determine the electrical properties of the body such as the electronic mobility of the insulating material, its conductivity and its dielectric constant. Knowledge of these properties is essential to determine the aptitude of new insulating materials for industrial use, for example in capacitors, electrical cables, semiconductors, electronic tubes.

STATE OF PRIOR ART

The state of prior art is illustrated by documents [1] to [12] listed at the end of this description.

For the purposes of studying the behavior of insulating materials subjected to strong fields, an understanding of charge injection phenomena within the volume of the material and the associated transport mechanisms is essential. In order to characterize these transient properties, a large number of articles suggest that one face of a sample of insulating material can be charged to a given electrical potential and then the variation of this potential can be monitored with time. The observed decay, called the "potential decay" is a natural phenomenon involving several physical processes such as the injection of charges in volume, polarization or conduction as described in documents [1] and [2]. In this case, it is particularly important to be able to use a process to perfectly control the initial conditions of the decay (quantity and nature of charges, spatial distribution) as to determine the injection and mobility of the charges correctly.

The samples must be previously charged before a potential decay experiment can be carried out. It is usually assumed that this charge is initially close to the surface of the sample. It is very critical to respect this condition in order to study the decay of the potential from its starting point, in other words for a maximum field. Consequently, the charge time must be practically instantaneous compared with the decay time. The potential is usually measured using a slaved potential probe (contact free measurement). Different charging techniques have been used in the past; using the corona effect described for example in document [3], using an electron beam described for example in document [4], or by contact described for example in document [5].

Studies carried out starting from corona discharges have enabled Ieda et al. in document [6] and then other authors later, for example in document [7], to confirm the existence of charges injection into a volume with a high electric field, by indirect effects. However, use of the corona effect is difficult to the extent that it uses a large number of gas ionization and ion deposition processes on the surface of the sample. The nature of the deposited charge and its distribution is then difficult to control. All that can be imposed precisely is the surface potential, without any guarantee about the nature and distribution of the charges. Different combinations of these parameters can give the same surface potential. Furthermore, since the experiment frequently takes place in an ambient atmosphere, a recombination of surface charges with ions in air contributes to the decay, which complicates application of the experiment.

The charge may be directly injected by using a high energy electron beam. With this type of technique, Watson characterized the energy level of traps in which the injected charges are located, in document [4]. More recently, Coelho et al. developed a device in the patent document [8] to measure the mobility of charges injected in an insulating material.

This technique is based on the use of the electron microscope beam to charge the sample. In document [9], Coelho also proposed to use the electrostatic mirror described in patent document [10] for local study of the potential decay on films a few tens of micrometers thick.

The use of an electron beam actually controls the quantity and type of carriers involved. However, the charge is not actually on the surface but is distributed over a thickness that depends very much on electron injection conditions (energy, current, focus, etc.). This thickness is difficult to control.

Furthermore, penetration of electrons imposes the use of samples that are much thicker than the electron stop depth. Consequently, this technique cannot be applied for studying thin layers.

Finally, an excessively high secondary electronic emission can create complex distributions between positive and negative charges. The use of this technique requires thorough knowledge of charge trapping phenomena in insulating materials, which is not always easy to understand.

In order to overcome the problem of electron penetration, charges can be injected by contact with a charged electrode (using an electron beam or a voltage generator). In this case the charge must overcome an energy barrier before penetrating into the material. The result is slower potential decay as described in document [6]. In document [11], Coelho suggested a model to describe this phenomenon. This technique has the advantage that it takes account of the influence of the insulating material/electrode interface in the injection process. This configuration is more representative of electrotechnical applications. It can also be used to study thin layers.

However, when the electron beam is directed directly onto the electrode, the effective energy of the beam reduces as a function of the increase in the potential of the electrode. However, the number of electrons actually remaining on the electrode depends directly on the beam energy. Consequently, the electron beam current can no longer be considered as being constant and may vary considerably during injection until it is cancelled out. The initial potential decay conditions (quantity and distribution of charges) are then not known precisely.

Therefore, regardless of the method used for charging, the quantity and nature of deposited charges are difficult to control satisfactorily. This distorts interpretation of the potential decay and consequently the validity of the associated transport models.

PRESENTATION OF THE INVENTION

The purpose of the charging process according to the invention is to overcome the disadvantages mentioned above in order to control the quantity and distribution of charges at the end of the charge and therefore at the beginning of the potential decay.

More precisely, the process according to the invention is a process for charging a structure formed from an insulating body sandwiched between two electrodes. It comprises the following steps:

a Faraday cage is placed in contact with one of the electrodes in the structure, the other electrode being made equal to a reference potential;

electrons originating from a controlled electron emission device are introduced into the Faraday cage, the electrons reaching the electrode with which it is in contact in order to charge the structure.

The structure and the Faraday cage can be placed in a vacuum chamber particularly to prevent recombination of electrons participating in the charge with ions in the atmosphere around the structure.

During the charge, the potential of the electrode in contact with the Faraday cage can be measured.

It is preferable to measure a secondary emission of electrons, if any, close to the Faraday cage to make sure that all electrons emitted by the controlled emission device actually participate in the charge.

At the end of the charge, the potential of the electrode in contact with the Faraday cage can be measured at different times, this potential variation representing a potential decay.

This invention also relates to a process for discharging a structure formed of an insulating body sandwiched between two electrodes that were previously charged by the previous charging process, this discharge process comprising a step to short circuit the structure.

The discharge can be obtained by bringing the Faraday cage to the potential of the controlled electron emission device, the reference potential being approximately equal to the potential of the emission device.

A current caused by the discharge when the structure is short circuited can be measured.

The potential of the electrode in contact with the Faraday cage can be measured at different times after the structure is completely discharged.

The present invention also relates to a device for charging a structure formed of an insulating body sandwiched between two electrodes, characterized in that it comprises a controlled electron emission device to inject electrons in a Faraday cage in contact with one of the electrodes in the structure, the other electrode being raised to a reference potential.

It is preferable to put the structure and the Faraday cage inside a vacuum chamber.

The controlled electron emission device may be placed outside the chamber.

The device may comprise a potential probe to make a contact free measurement of the potential of the electrode in contact with the Faraday cage.

The Faraday cage may comprise a solid sidewall, a solid bottom in contact with the electrode of the structure, and at the end opposite to the bottom, a cover in which there is an opening through which electrons from the said controlled electron emission device can arrive.

It is preferable to provide a secondary electron detection device to detect any secondary electrons leaving the Faraday cage through the opening.

The height of the cage from the bottom to the cover is advantageously more than each of its other dimensions to prevent electrons from rising to the diaphragm. This thus improves the trapping efficiency of the Faraday cage.

The area occupied by the Faraday cage on the electrode is advantageously less than the area of the electrode.

The charge device may charge a structure in which the electrode in contact with the Faraday cage is coupled with a arcing horn or electrode field???, and in this configuration it preferably comprises means of bringing the guard electrode up to the same potential as the electrode in contact with the Faraday cage.

A heating and/or cooling device may be provided to adjust the temperature in the vicinity of the structure.

The charging device may be adapted to discharge the structure, and in this configuration it comprises means of short circuiting the structure.

The short circuiting means may make an electrical connection between the Faraday cage and the ground of the controlled emission device corresponding to the reference potential.

The device may then comprise a device for measuring the current caused by discharging the structure.

BRIEF DESCRIPTION OF THE FIGURES

The present invention will be better understood after reading the description of example embodiments given purely for guidance purposes and that are in no way limitative, with reference to the attached drawings, wherein.

DETAILED PRESENTATION OF PARTICULAR EMBODIMENTS

Figure 1:
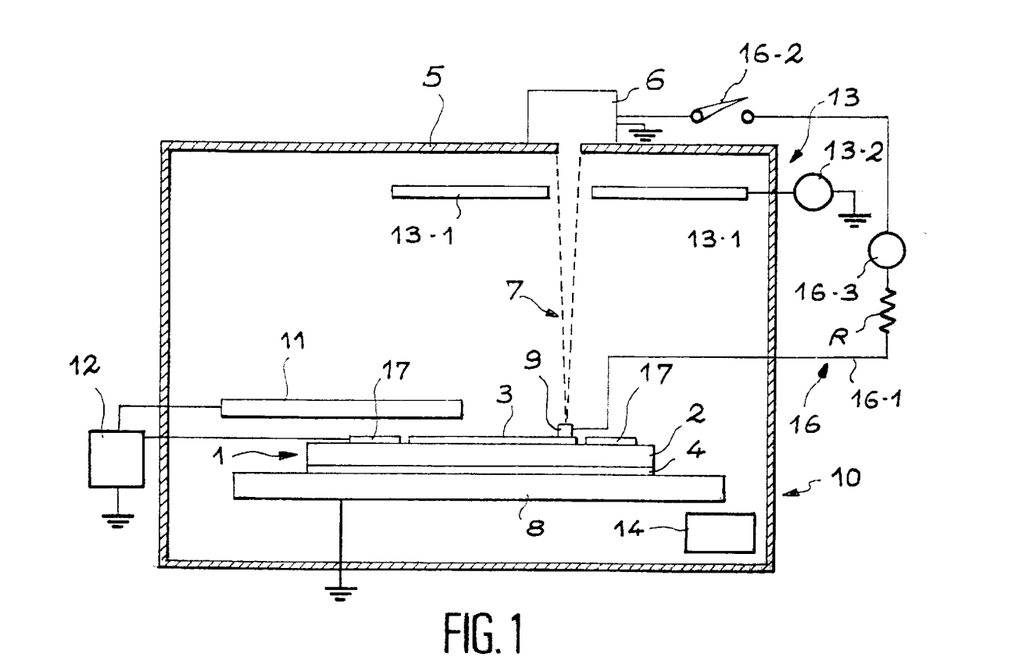
FIG. 1 diagrammatically shows a device for charging a structure formed from an insulating body sandwiched between two electrodes conform with the invention.

FIG. 1 diagrammatically shows a charging device 10 for a structure 1 formed from an insulating body 2 sandwiched between a first electrode 3 and a second electrode 4. The material from which the insulating body 2 is made may be chosen from among polymers, ceramics based for example on oxides, nitrides, borides, carbides, or glass, these materials being used alone or in combination. The insulating body 2 may be in the form of a thick block, or a film or a thin layer, and its thickness is chosen so as to obtain a sufficiently strong electric field to inject charges into the insulating body. The electrodes 3, 4 may be metallic or semiconducting.

The structure may be made using known techniques, for example the insulating body may be obtained by molding, machining or pressing pellets, the electrodes may be made by pressing, gluing, painting, chemical vapor phase deposition, physical vapor phase deposition or other methods.

Structure 1 illustrated in FIG. 1 shows a plane capacitor but it could use a capacitor with a more complex geometry, for example a wound capacitor. The plane capacitor may comprise an additional electrode 17 called the guard electrode coupled to one of the electrodes. It is located on the same face of the insulating body 2 as the electrode with which it is coupled. In this case, the guard electrode surrounds the first electrode 3. This guard electrode 17 limits edge effects.

The first electrode 3 of the structure 1 is in contact with the Faraday cage 9 that will be described in more detail later with reference to FIG. 2.

The structure 1 and the Faraday cage 9 in the example described are placed inside a chamber 5. The structure 1 is located on a sample support 8 in the chamber 5. The second electrode 4 is supported on the sample support 8, and its potential is increased to a reference potential, usually the potential of the chamber 5 (the ground).

A potential measurement device 11 is provided to measure the potential of the first electrode 3. This device 11 may then be in the form of a potential probe that makes a contact free measurement of the potential at the surface of the first electrode 3. The potential probe 11 is close to the first electrode 3. A vibrating capacitor type potential probe is suitable.

The Faraday cage 9 cooperates with a controlled electron emission device 6. This controlled electron emission device 6 is useful for producing a controlled electron beam 7 inside the Faraday cage 9. In the example, the controlled electron emission device 6 is located outside the chamber 5. It is fixed to it. The electron beam 7 is injected into the chamber 5 before reaching the Faraday cage 9. Preferably, the electron beam 7 is focused to control the dimensions of the zone bombarded by electrons and its intensity is adjustable.

The electrons 7 that enter the Faraday cage 9 cannot leave it by conventional emission. They are conducted by the conducting material of the Faraday cage 9 towards the first electrode 3 with which it is in contact and can thus be distributed over the entire surface of the first electrode 3 and charge the structure 1. The Faraday cage 9 traps electrons and transmits almost all electrons to the structure 1. It is then easy to find out the quantity of charges deposited on the first electrode 3, making use of the value of the current in the electron beam 7 and the injection time in the Faraday cage 9. If the electrons had bombarded the electrode 3 directly, a non-negligible proportion of them would have been re-emitted in chamber 5, and therefore this proportion would not have participated in charging the structure 1.

This controlled electron emission device 6 may be made by a scanning electron microscope, a Castaing microprobe or any other assembly provided with an electron gun. It is also preferable to provide an electronic current calibration system and a system for controlling the electron emission time in chamber 5, butt these systems are not shown.

The maximum charge potential is limited only by the maximum energy of the electron beam 7 and the maximum read voltage of the potential probe 11.

Charging can take place instantaneously, continuously or in the form of charge packets for which the repetition frequency and charge quantity can be varied.

The chamber 5 is a vacuum chamber, which in particular prevents combinations between electrons and ions located in chamber 5, particularly once the charge is terminated.

Figure 2:
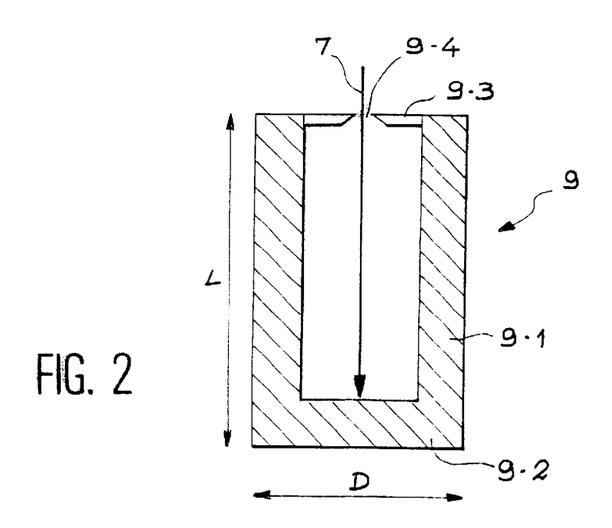
FIG. 2 shows a section through a Faraday cage used in the device in FIG. 1.

We will now see the structure of the Faraday cage 9 with reference to FIG. 2.

The Faraday cage 9 comprises a solid side wall 9-1, for example a cylindrical wall, with firstly a solid bottom 9-2 that will come into electrical contact with the first electrode 3, and secondly a cover 9-3 in which there is an opening 9-4 to allow electrons to penetrate into the Faraday cage. The opening is small to prevent electrons that penetrate into the Faraday cage from leaving it. The Faraday cage is metallic, and may for example be made from non-magnetic stainless steel.

Preferably, the height H of the Faraday cage is greater than each of the other dimensions: length, width or diameter D in the case of a cylindrical shape as shown in FIG. 2.

The area occupied by the Faraday cage 9 on the first electrode 3 is significantly less than the area occupied by the first electrode 3, so that it is negligible.

It is preferable to provide a device 13 for detecting a secondary emission, if any, in the chamber 5. This secondary emission may be provoked by electrons bombarding the cover at the opening 9-4 when the electron beam 7 is not sufficiently focused. The detection device 13 may comprise a drilled plate 13-1 made of a conducting material and means (13-2) of measuring an electrical current in this plate 13-1. The plate 13-1 is placed in the chamber 5 such that the electron beam 7 passes through it and it is located between the controlled electron emission device 6 and the Faraday cage 9.

A heating and/or cooling device 14 may be provided to adjust the temperature close to the structure 1. Measurements can then be made at controlled temperatures.

When a guard electrode 17 is being used, its potential is adjusted until it is at the same potential as the electrode to which it is coupled, in this case the first electrode 3 in contact with the Faraday cage. A zero electrical field is set up between them. Means 12 are provided to make sure that they have the same potential. A voltage generator 12 outputs the same potential to the guard electrode 17 as the potential recorded by potential probe 11, and is connected to the guard electrode 17 and slaved to the potential measured by the probe 11.

The measurement of the variation of the potential at the first electrode 3 is used to determine the static capacity of the capacitor thus charged, the dielectric constant of the insulating material of the body 2, and the injection field.

At the end of the charge, the potential decay can be measured as a function of time using the potential probe 11.

These measurements can lead to the determination of the mobility of charges in the dielectric body 2 and the intrinsic conductivity of the dielectric material as a function of the electric field to which it is submitted.

During the study of the electrical properties of such structures, it is usual to observe the reappearance of a potential on the previously charged and then short circuited structure. This phenomenon is called "potential return". It may be necessary to discharge structure 1 to determine the charge density and the depth of charges in the dielectric body 2.

The discharge may begin when the potential on the first electrode 3 no longer changes. The structure is discharged by short circuiting it. This is done by putting the Faraday cage into contact with the ground of the chamber 5 or the controlled electron emission device 6, which is equivalent. The two electrodes of structure 1 are then approximately at the same potential. The charge device may be equipped with means 16 of discharging the structure. An electrical connection 16-1 may be made provided with a switch 16-2 to electrically connect the Faraday cage 9 with the ground of the controlled electron emission device 6. This switch 16-2 is in the open position during charging and in the closed position during discharging. A resistance R and a current measurement device 16-3 may be put in series with the switch 16-2 to measure the discharge current through the resistance R, when this short circuit is set up.

After the structure 1 has completely discharged, the variation of the potential with time at the first electrode 3 is measured using the potential probe 11, this variation representing the potential return from the structure 1.

We will now study three samples charged using the process according to the invention.

EXAMPLE 1

Charging a Polyethylene Film and Calculating the Static Dielectric Constant and the Injection Field A 46 micrometer thick polyethylene film was obtained using pellets put in a mould and hot pressed using an 80 mm diameter conducting plate that will be used as a second electrode. This plate is then put into contact with the sample holder. A Kapton sheet was placed at the bottom of the mould to facilitate separation of the film. The other face of the film was metallized with gold over a 50-millimeter diameter to form the first electrode that will support the Faraday cage. No guard electrode was made. The film thus metallized was placed in a chamber similar to that shown in FIG. 1. The electrons were deposited in 5 nC packets.

Figure 3:
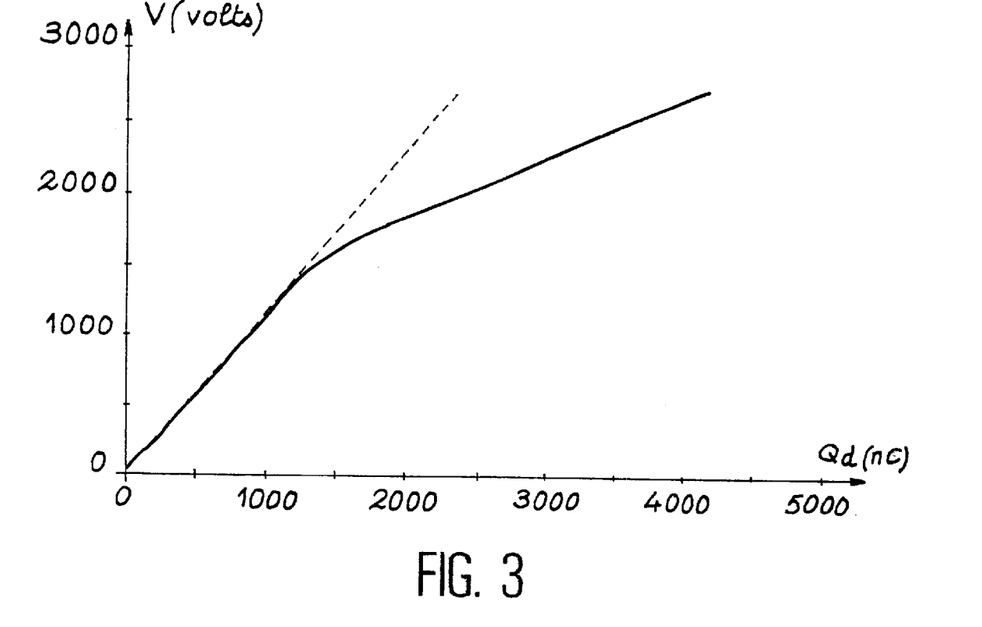
FIG. 3 shows the variation in the potential of the first electrode as a function of the quantity of charges deposited on the electrode.

FIG. 3 shows the potential variation V as a function of the quantity of charges $Q_d$ deposited on the first electrode.

In order to interpret this measurement, it is assumed that the surface of the first electrode is very much greater than the surface of the Faraday cage and that these two elements are equipotential. If it is considered that the electrons deposited in the Faraday cage remain at the same level as the first electrode, its potential V measured by the potential probe as a function of the quantity of deposited electrons $Q_d$ respects the capacitance equation:

$$V=Q_d/C \quad \{2\}$$

Therefore, the charging device according to the invention can be used to determine the static capacity of a capacitor using equation {2} since the quantity of deposited electrons $Q_d$ is known precisely. In this example, the value of the measured capacitance starting from the original slope is 871 pF, corresponding to a static dielectric constant of 2.31. The slope is shown in dashed lines, while the variation curve is shown in solid lines in FIG. 3.

When the electric field becomes strong, a proportion $Q_p$ of the electrons is lost. The potential V then increases less quickly. It can be considered that the electrons are injected through the first electrode dielectric film interface. $Q_p$ can then be determined using the following equation:

$$Q_p=Q_d-Q_c \quad \{3\}$$

where
  $Q_d$=quantity of electrons deposited,
  $Q_c$=quantity of electrons necessary to obtain a potential V starting from relation {2}. Consequently:

$$Q_c=C.V \quad \{4\}$$

The injection potential $V_i$ corresponds' to the potential starting from which $Q_p$ is no longer zero. If a plane capacitor is used, it is easy to deduce the value of the injection field $E_i$ using the following relation:

$$E_i=V_i/h \quad \{5\}$$

where h is the thickness of the polyethylene film.

Figure 4:
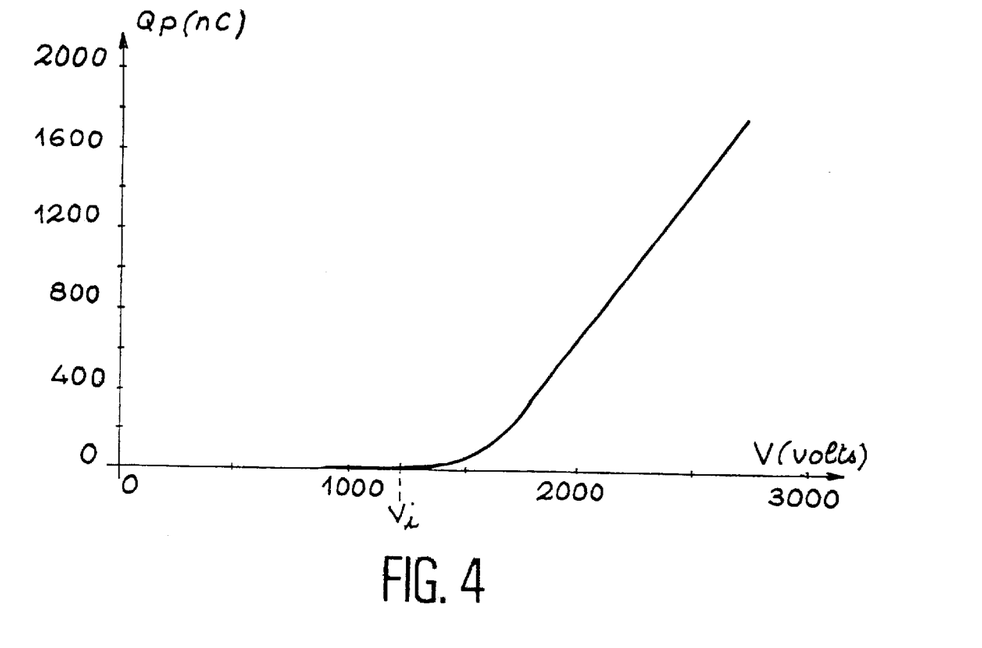
FIG. 4 shows the variation of the quantity of electrons lost as a function of the potential of the first electrode.

FIG. 4 shows the variation of the quantity of electrons lost $Q_p$ as a function of the potential V of the first electrode. The injection potential $V_i$ is about 1200 V corresponding to an injection field $E_i$ of 26 kV/mm. Therefore, the charging device according to the invention can be used to determine the value of the injection field, and this magnitude depends on the nature of the first electrode and the insulating body.

EXAMPLE 2

Measurement of the Potential Decay and Calculation of the Mobility of Charges and the Conductivity as a Function of the Field We will use a 114-micrometer thick polyethylene film obtained according to the procedure described in example 1. A 1 microCoulomb electron charge was deposited on the first electrode as in example 1. At the end of the injection phase, the charge quantity remaining on the surface of the electrode and the charge quantity lost by conduction during injection, are known perfectly. The potential decay of the first electrode as a function of time is then measured.

Figure 5:
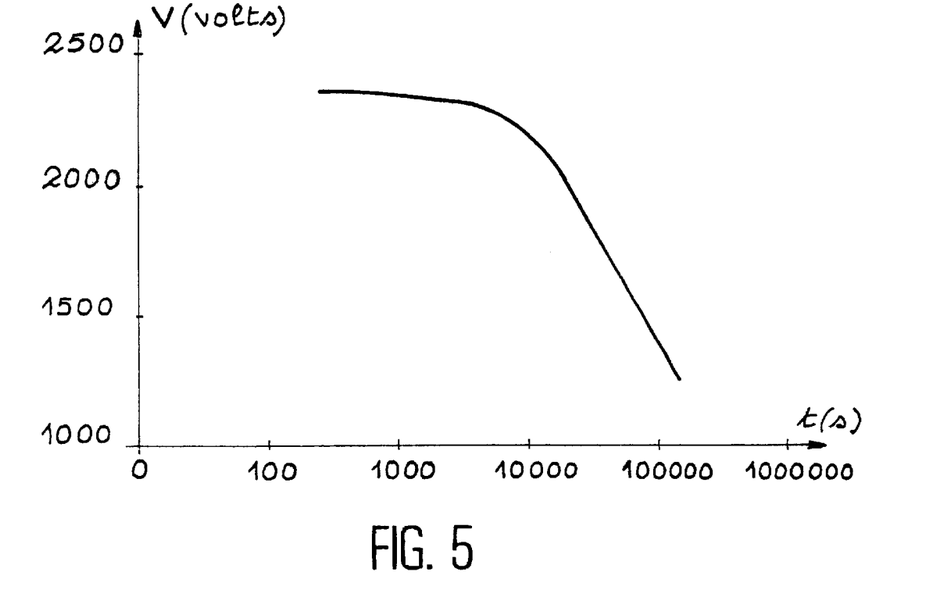
FIG. 5 shows the variation in the potential of the first electrode as a function of the decay time.
Figure 6:
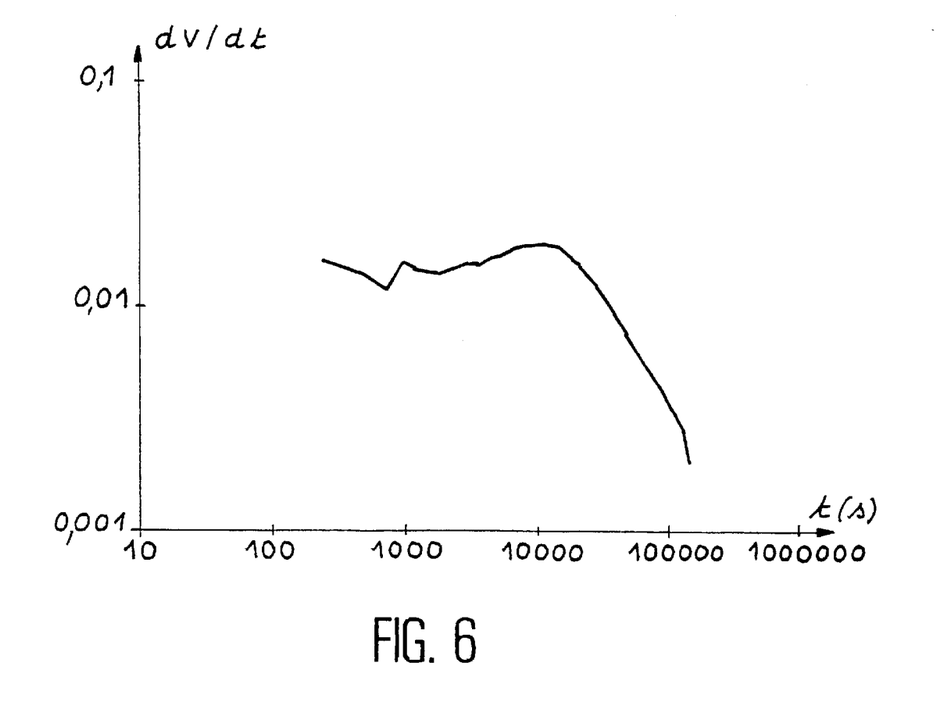
FIG. 6 shows the variation of the decay rate as a function of the decay time.

FIG. 5 shows the variation of the potential V as a function of the decay time t. The decay rate dV/dt is usually measured as a function of time, particularly because it can be used to determine the transit time $T_t$ of the injected charge from the first electrode to the second electrode. dV/dt is considered to be constant during the transit, as can be seen in FIG. 6. Beyond $T_t$, the decay rate drops quickly. It is then possible to calculate the average velocity $\overline{V}$ of charges injected during transit using the following relation:

$$\overline{V}=h/T_t \quad \{6\}$$

However, the mobility of charges u is defined by the relation:

$$V=\mu.E \quad \{7\}$$

Therefore, it is easy to deduce the average mobility $\overline{\mu}$ starting from the average speed $\overline{V}$ and the average field $\overline{E}$ during transit.

$$\overline{\mu}=h/(T_t\overline{E}) \quad \{8\}$$

In example 2, the average field E during transit is 20 kV/mm and the transit time. $T_t$ is 2300 seconds. The average mobility $\overline{\mu}$ calculated from relation {8} is then $2.5\times10^{-16}$ m²/V.S.

To access the intrinsic conductivity as a function of the field, we propose a solution that consists of considering the structure as being a capacitor that discharges into its leakage resistance.

Consider the relaxation time $\tau=\epsilon/\sigma$ where $\epsilon$ is the dielectric constant of the insulating film and $\sigma$ is its conductivity. If $\tau$ were constant, the decay would be exponential; but since the conductivity $\sigma$ varies with the electrical field, $\tau$ increases during the discharge. The potential V of the first electrode satisfies the following differential equation:

$$dV/dt=-V/\tau \quad \{9\}$$

which is used to express the intrinsic conductivity of the insulating material:

$$\sigma=-\epsilon/V.(dV/dt) \quad \{10\}$$

The variations of the conductivity as a function of the voltage can be plotted, which shows that the record of the decay contains the same information as a current curve as a function of the conventional voltage, which is considerably more difficult to obtain.

However, the question may be asked about whether or not this approach is valid. For example, the experimental conductivity is compared with the value predicted using the Poole-Frenkel model:

$$\sigma = \sigma_0 \exp\left(\frac{\beta_{PF}}{kT}\left(\frac{V}{h}\right)^{1/2}\right) \quad \{11\}$$

where h is the thickness of the polyethylene film, $\sigma_0$ is the intrinsic conductivity at zero field, $\beta_{PF}$ is the Poole-Frenkel constant, k is Boltzman's constant and T is the temperature of the structure expressed in degrees Kelvin.

In the case of polyethylene, for which the relative dielectric constant is 2.3, the previous expression may be transformed into:

$$\text{Log}_{10}\sigma(V) \approx A + 0.8\sqrt{\frac{V}{h}} \quad \{12\}$$

where A is a constant and h is the thickness of the polyethylene film expressed in micrometers.

Figure 7:
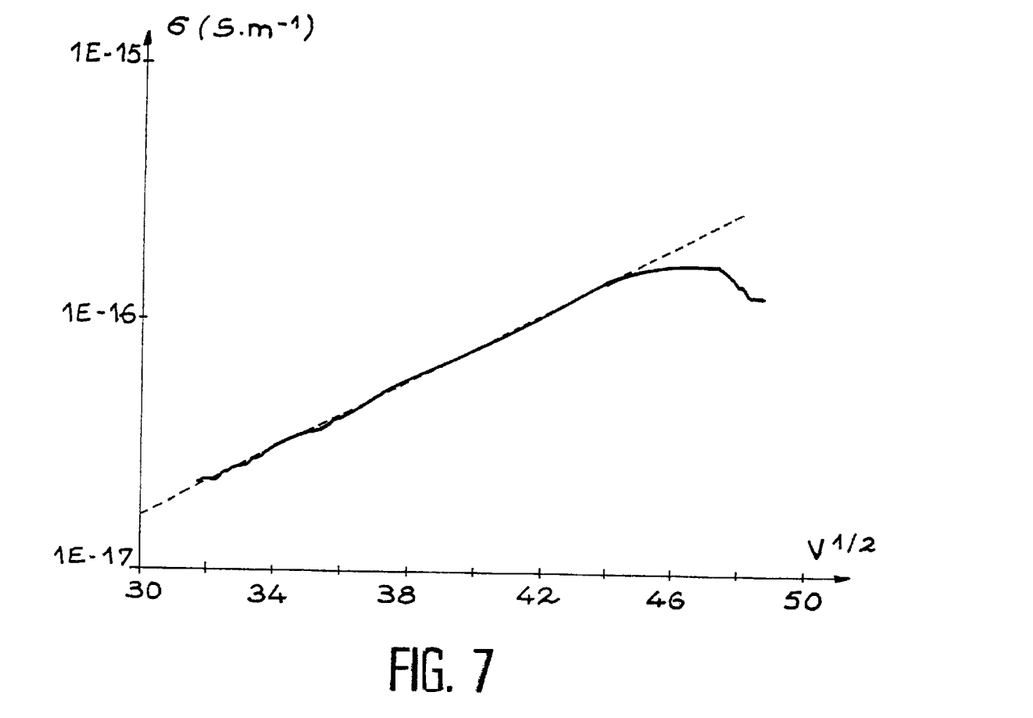
FIG. 7 shows the conductivity of the insulating material in the structure as a function of the square root of the potential of the first electrode, with a semi-logarithmic scale.

The model is confirmed if the curve $\sigma(V)$ as a function of the square root of the potential V in semi-logarithmic coordinates, contains a linear area with a slope approximately equal to $0.8/h^{1/2}$. This curve is illustrated in FIG. 7. In our example, this theoretical slope is equal to 0.075.

The conductivity of the insulating material on the film was estimated using relation {10}. It can be seen that the Poole Frenkel equation is remarkably well satisfied over a large part of the curve in FIG. 7 (the experimental slope is equal to 0.07). Thus, in this area, the variation of the intrinsic conductivity of the insulating material is obtained as a function of the electric field applied to the structure.

EXAMPLE 3

Measurement of the Potential Return

Figure 8:
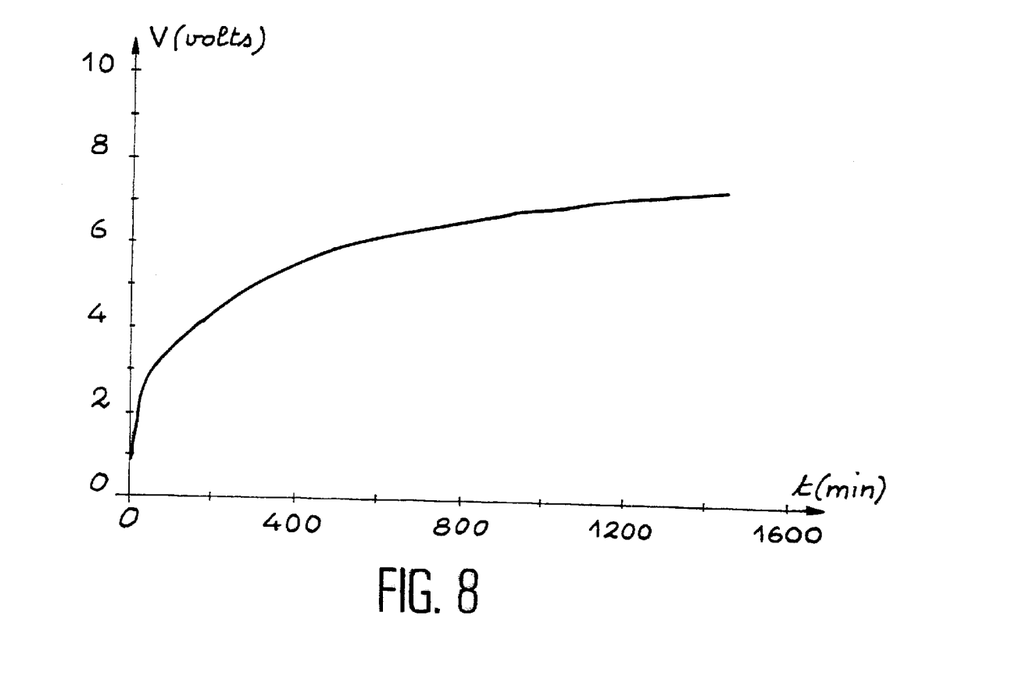
FIG. 8 shows the variation of the potential after short circuiting the structure.

FIG. 8 shows a representation of the potential return measured on a 120-micrometer polyethylene film obtained according to the process described in example 1. The potential of the structure made using this film was initially raised to 2084 volts using the charging process described in example 1. After a given potential decay time during which the potential of the structure changed to 1565 volts (see example 2), the structure was short circuited so as to eliminate the potential of the top electrode, and then the potential probe was used to measure the new variation of this potential as a function of time.

Details of the theoretical approach for this potential return phenomenon are described in document {12}. Assuming that the charges are distributed in a plane at an initial depth $\lambda$, it is proposed to calculate the charge density q and the initial depth of charges $\lambda$ using the following formulas:

$$q = \varepsilon\frac{V_0 + V_\infty}{h} \quad \{13\}$$

$$\lambda = \frac{V_\infty}{V_0 + V_\infty}h \quad \{14\}$$

where:
h insulating film thickness
$\varepsilon$ dielectric constant of the insulating film
$V_0$ potential before short circuiting
$V_\infty$ stable potential after an infinite return time.

The result in the case in example 3 is:
q=0.00026 C.m$^{-2}$ and $\lambda$=0.6×10$^{-6}$ m.

The advantage of the charging and discharging process thus described is that it can be used to determine the charge injection field and the charge mobility, starting from a single test. Furthermore, the initial decay parameters, in other words the quantity and distribution of charges, are perfectly controlled so that the decay and the potential return measurements can be used correctly. Finally, since charges are injected through an electrode, it is possible to study the very thin layers of an insulating body.

Although one embodiment of this invention has been described and illustrated in detail, it is easily understandable that different changes and modifications can be made without being outside the scope of the invention.

REFERENCES

[1]—P. Moliné, "Potential decay interpretation on insulating films: necessity of combining charge injection and slow volume polarization processes", 7$^{th}$ International Conference on DMMA (IEEE), September 1996.

[2]—A. Crisci et al., <<Surface potential decay due to surface conduction>>, Eur. Phys. J. AP, 4, 107–116, 1998.

[3]—J. Kyokane, "A consideration on decay process of an accumulated charge of polymer surfaces", Electrical Engineering in Japan, 102, 1, 89–95, 1982.

[4]—P. K. Watson, "The energy distribution of localized states in polystyrene, based on isothermal discharge measurements", J. Phys. D: Appl. Phys., 23, 1479–1484, 1990.

[5]—D. K. Das Gupta, "Surface charge decay on insulating films", IEEE International Symposium on electrical Insulation, Boston Mass., 1988.

[6]—M. leda et al., <<Decay of electric charges on polymeric films", Electrical Engineering in Japan, 88, 6, 1968.

[7]—T. J. Sonnonstine et al., <<Surface potential decay in insulators with field-dependent mobility and injection efficiency>>, J. Appl. Phys., 46, 9, 3975–3981, 1975.

[8]—European patent EP-A-0 710 848.

[9]—R. Coelho et al., <<The high field transport properties of polyethylene investigated by the electrostatic mirror technique>>, International Conference on DMMA (IEEE), 2000.

[10]—European patent EP-A-0 470 910.

[11]—R. Coelho et al., <<Charge decay measurements and injection in insulators>>, J. Phys. D: Appl. Phys., 22, 1406–1409, 1989.

[12]—R. Coelho et al., <<On the return-voltage buildup in insulating materials>>, IEE Transactions on Electrical Insulation, 22, 6, 683–690, 1987.

What is claimed is:

1. Process for charging a structure formed from an insulating body sandwiched between first and second electrodes, comprising:
   placing a Faraday cage in contact with the first electrode of the structure, a potential of the second electrode being made equal to a reference potential;
   introducing electrons originating from a controlled electron emission device into the Faraday cage, the electrons reaching the first electrode with which the Faraday cage is in contact, to charge the structure.

2. Charging process according to claim 1, wherein the structure and the Faraday cage are placed in a vacuum chamber.

3. Charging process according to claim 1, wherein during the charge, the potential of the first electrode in contact with the Faraday cage is measured.

4. Charging process according to claim 1, further comprising measuring a secondary emission, if any, of electrons close to the Faraday cage.

5. Charging process according to claim 3, wherein the potential of the first electrode in contact with the Faraday cage is measured at different times, variation in the potential representing a potential decay.

6. Process for discharging a structure formed of an insulating body sandwiched between the first and second electrodes that were previously charged by the charging process according to claim 1, comprising short circuiting the structure.

7. Discharging process according to claim 6, wherein the Faraday cage is brought to the potential of the controlled electron emission device, the reference potential being approximately equal to the potential of the controlled electron emission device.

8. Discharging process according to claim 6, further comprising measuring a current caused by the discharge when the structure is short circuited.

9. Discharging process according to claim 6, further comprising measuring the potential of the first electrode in contact with the Faraday cage at different times after the structure is completely discharged.

10. Device for charging a structure formed of an insulating body sandwiched between first and second electrodes, comprising:

a controlled electron emission device configured to inject electrons into a Faraday cage in contact with the first electrode in the structure, the second electrode being raised to a reference potential.

11. Charging device according to claim 10, wherein the structure and the Faraday cage are placed inside a sealed chamber.

12. Charging device according to claim 11, wherein the controlled electron emission device is placed outside the sealed chamber.

13. Charging device according to claim 10, wherein the device further comprises a potential probe configured to make a contact free measurement of the potential of the first electrode in contact with the Faraday cage.

14. Charging device according to claim 13, wherein the Faraday cage comprises a solid sidewall, a solid bottom in contact with the first electrode of the structure, and at an end opposite to the solid bottom, a cover having an opening through which electrons can pass.

15. Charging device according to claim 13, further comprising a secondary electron detection device configured to detect secondary electrons leaving the Faraday cage through the opening.

16. Charging device according to claim 14, wherein a height of the Faraday cage from the bottom to the cover is larger than each of its other dimensions.

17. Charging device according to claim 14, wherein an area occupied by the Faraday cage on the first electrode is less than an area of the first electrode.

18. Charging device according to claim 10, configured to charge a structure in which the first electrode in contact with the Faraday cage is coupled with a guard electrode, comprising means for bringing the guard electrode up to a same potential as the first electrode in contact with the Faraday cage.

19. Charging device according to claim 10, further comprising at least one of a heating and cooling device configured to adjust a temperature in a vicinity of the structure.

20. Charging device according to claim 10, wherein the charging device is configured to discharge the structure, and comprising means for short circuiting the structure.

21. Charging device according to claim 20, wherein the short circuiting means makes an electrical connection between the Faraday cage and ground of the controlled electron emission device corresponding to the reference potential.

22. Charging device according to claim 20, further comprising a device configured to measure current caused by discharging the structure.

* * * * *